(12) United States Patent
Orlowski et al.

(10) Patent No.: US 7,166,897 B2
(45) Date of Patent: Jan. 23, 2007

(54) METHOD AND APPARATUS FOR PERFORMANCE ENHANCEMENT IN AN ASYMMETRICAL SEMICONDUCTOR DEVICE

(75) Inventors: Marius K. Orlowski, Austin, TX (US); Vance H. Adams, Austin, TX (US); Chun-Li Liu, Mesa, AZ (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 10/924,650

(22) Filed: Aug. 24, 2004

(65) Prior Publication Data

US 2006/0043498 A1 Mar. 2, 2006

(51) Int. Cl.
*H01L 31/119* (2006.01)
*H01L 21/336* (2006.01)

(52) U.S. Cl. .............. 257/396; 257/E21.182; 257/E21.207; 257/408; 438/286

(58) Field of Classification Search ............. 257/69, 257/19, 55, 63, E21.182, E21.207, E29.297, 257/E29.193, 408, 396; 438/286
See application file for complete search history.

(56) References Cited

U.S. PATENT DOCUMENTS

| | | | |
|---|---|---|---|
| 5,849,440 A | 12/1998 | Lucas et al. | |
| 5,858,830 A | 1/1999 | Yoo et al. | |
| 6,103,020 A | 8/2000 | Roberts et al. | |
| 6,197,632 B1 | 3/2001 | Bronner et al. | |
| 6,541,382 B1 | 4/2003 | Cheng et al. | |
| 6,605,498 B1 | 8/2003 | Murthy et al. | |
| 6,621,131 B2 | 9/2003 | Murthy et al. | |
| 2004/0061191 A1* | 4/2004 | Paton et al. ............... | 257/412 |
| 2004/0084735 A1* | 5/2004 | Murthy et al. ............. | 257/408 |
| 2005/0287752 A1* | 12/2005 | Nouri et al. ............... | 438/303 |

FOREIGN PATENT DOCUMENTS

WO WO02/45156 A2 6/2002

OTHER PUBLICATIONS

Ouyang, Qiqing Christine et al.; "Built-in Longitudinal Field Effects in Sub-100-nm Graded $Si_{1-x}Ge_x$ Channel PMOSFETs"; IEEE Transactions on Electron Devices; Jun. 2001; pp. 1245-1250; vol. 48, No. 6; IEEE.

(Continued)

*Primary Examiner*—Long Tran
(74) *Attorney, Agent, or Firm*—Joanna G. Chiu; Kim-Marie Vo

(57) ABSTRACT

A method and apparatus is presented that provides performance enhancement in a semiconductor device. In one embodiment, a first current region (64, 76, 23), a channel region and a second current region (75, 33, 66) are adjacent each other. The second current region (75, 33, 66) has a content of a first element of an alloy greater than a content of the first element in the first current region (64, 76, 23), wherein the second current region (75, 33, 66) has a content of the first element greater than a content of the first element in the channel region, the alloy further comprises a second element, the first element has a first valence number, and the second element has a second valence number. Furthermore, the sum of the first valence number and the second valence number is eight.

24 Claims, 4 Drawing Sheets

OTHER PUBLICATIONS

Gannavaram, Shyam et al.; "Low Temperature (≦800° C.) Recessed Junction Selective Silicon-Germanium Source/Drain Technology for sub-70 nm CMOS"; IEDM 2000; 2000; pp. 18.3.1-18.3.4; IEEE.

Öztürk, M.C. et al.; "Ultra-Shallow Source/Drain Junctions for Nanoscale CMOS Using Selective Silicon-Germanium Technology"; Extended Abstracts of International Workshop on Junction Technology; 2001; pp. 5-1-1 thru 5-1-6.

Streit, Dwight C. et al.; "High Performance HBT's with Built-in Base Fields: Exponentially-Graded Doping vs Graded Composition"; Proceedings IEEE/Cornell Conference on Advanced Concepts in High Speed Semiconductor Devices and Circuits; Aug. 5-7, 1991; pp. 325-333; IEEE.

Ghani et al., "A 90nm High Volume Manufacturing Logic Technology Featuring Novel 45nm Gate Length Strained Silicon CMOS Transistor," 0-7803-7873-3/03 *IEEE*, 2003, 3 pgs.

Sleight et al., Stress Induced Defects and Transistor Leakage for Shallow Trench Isolated SOI, *IEEE Electron Device Letters*, vol. 20, No. 5, May 1999, pp. 248-250.

Lander et al., "High Hole Mobilities in Fully-Strained $Si_{1-x}Ge_x$ Layers (0.3 <x<0.4) and Their Significance for SiGe pMOSFET Performance," IEEE Transactions on Electron Devices, vol. 48, No. 8, Aug. 2001, pp. 1826-1832.

Ernst et al., "A New Si:C Epitaxial Channel nMOSFET architecture With Improved Drivability And Short-Channel Characteristics," 2003 IEEE Symposium on VLSI Technology Digest of Technical Papers, pp. 51-52.

Shima et al., "<100>Channel Strained-SiGe p-MOSFET With Enhanced Hole Mobility and Lower Parasitic Resistance," 2002 Symposium on VLSI Technology Digest of Technical Papers, pp. 94-95.

* cited by examiner

METHOD AND APPARATUS FOR PERFORMANCE ENHANCEMENT IN AN ASYMMETRICAL SEMICONDUCTOR DEVICE

RELATED APPLICATIONS

This application is related to U.S. application Ser. No. 10/925,108, entitled "Method and apparatus for mobility enhancement in a semiconductor device," and filed on even date and is assigned to the current assignee hereof.

FIELD OF THE INVENTION

This invention relates to semiconductor devices, and more particularly, to asymmetrical semiconductor devices that have enhanced performance.

RELATED ART

In the manufacture of semiconductor devices, silicon has been by far the most popular choice for the semiconductor material. Transistor performance has been enhanced regularly through a variety of process improvements. One of the improvements has been to alter the stress in the silicon in order to improve mobility. Some of the techniques have included using other materials in addition to the silicon to bring about the stress and the consequent mobility improvement. For example, a silicon layer that has germanium added results in a silicon germanium layer that is under compressive stress. Such a silicon germanium layer under compressive stress is useful in improving the mobility of the carriers for a P channel transistor. Similarly, finding ways to create tensile stress is useful for improving the mobility of the carriers for an N channel transistor.

A variety of techniques have been developed for achieving either uni-axial tensile or compressive stresses in a symmetric fashion. However, the achievement of such symmetrical uni-axial stresses results in spatial variations of the energy bands which may oppose the electronic transport in the device and thus be detrimental to the device performance. Therefore, there is a need for an improved device in which spatial variations of the energy bands facilitate electronic transport, thus allowing for enhanced performance.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor device has asymmetrical source and drain regions in which the stresses of the asymmetrical source and drain region result in spatial variations of the energy bands which facilitates electronic transport. This is better understood by reference to the figures and the following description.

Figure 1:
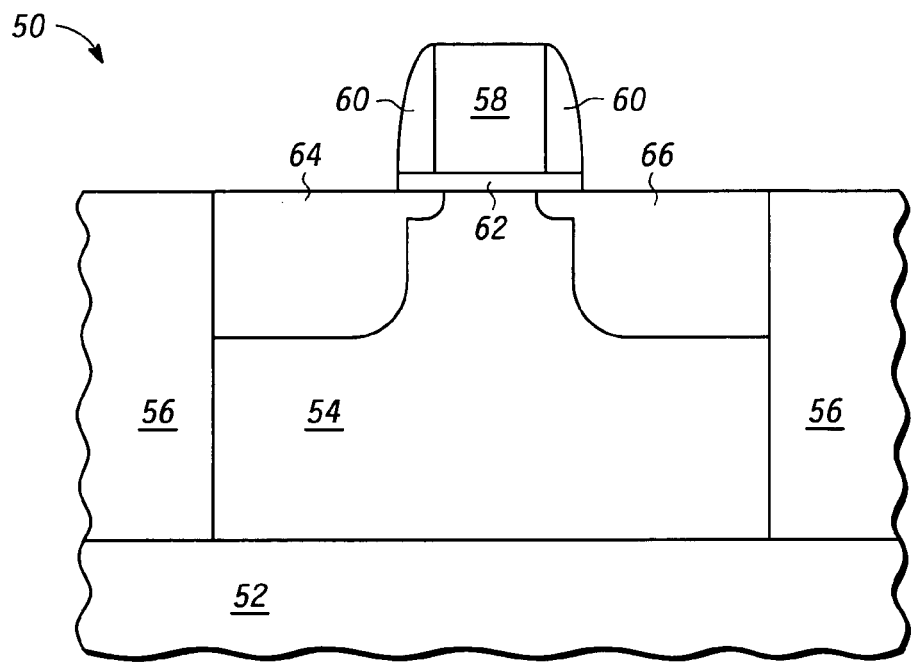
FIG. 1 is a cross section of a semiconductor structure at a first stage in processing according to one embodiment of the present invention.

Shown in FIG. 1 is a semiconductor structure 50, comprising an insulating layer 52, a semiconductor layer 54 on insulating layer 52, a trench isolation 56 surrounding semiconductor layer 54, a gate dielectric 62 (also referred to as a gate insulator 62) on semiconductor layer 54, a gate 58 (also referred to as a control electrode 58) on gate dielectric 62, a sidewall spacer 60 surrounding gate 58, a source region 64 in semiconductor layer 54 on one side of gate 58 (where source region 64 includes an extension region which extends under sidewall spacer 60 and a deep implant region which extends deeper into semiconductor layer 54 as compared to the extension region), and a drain region 66 in semiconductor layer 54 on another side of gate 58 (where drain region 66 includes an extension region which extends under sidewall spacer 60 and a deep implant region which extends deeper into semiconductor layer 54 as compared to the extension region).

Note that conventional materials and processing techniques may be used to form semiconductor structure 50 up to the stage of processing illustrated in FIG. 1. Also, note that gate 58 may be any type of transistor gate formed of any material or stack of materials. In the illustrated embodiment, semiconductor layer 54 is a portion of a semiconductor on insulator (SOI) substrate. In an alternate embodiment, semiconductor layer 54 may be a portion of a bulk semiconductor substrate in which insulating layer 52 is not present. In one embodiment, semiconductor layer 54 is formed of a first element, such as, for example, silicon.

Figure 2:
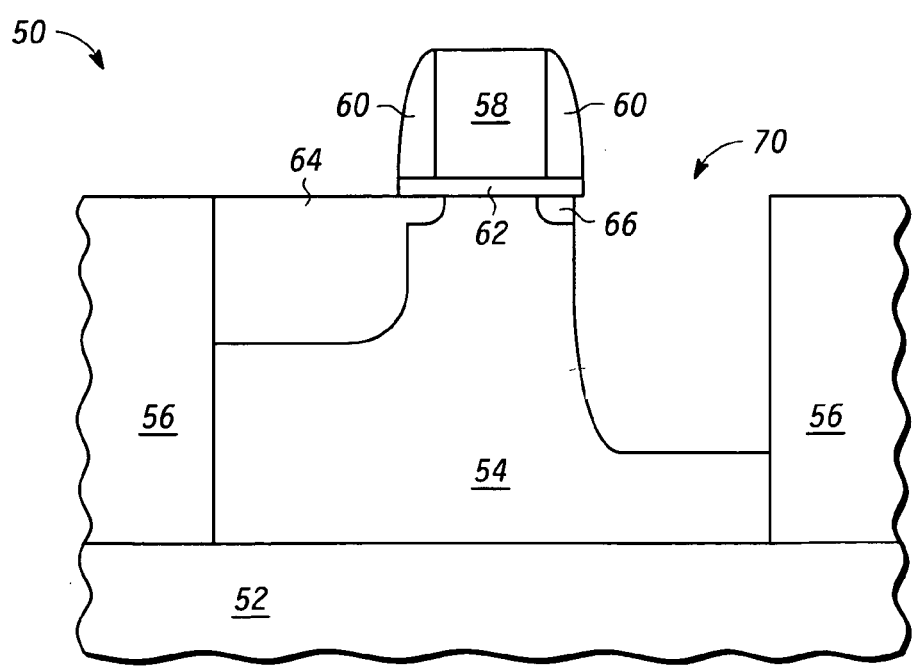
FIG. 2 is a cross section of the semiconductor structure of FIG. 1 at a subsequent stage in processing according to one embodiment of the present invention.

Shown in FIG. 2 is semiconductor structure 50 after etching through portions of drain region 66 and into semiconductor layer 54, to leave a recess 70 on one side of gate 58. The etch may also leave a portion of drain region 66 underlying spacer 60 and gate 58.

Figure 3:
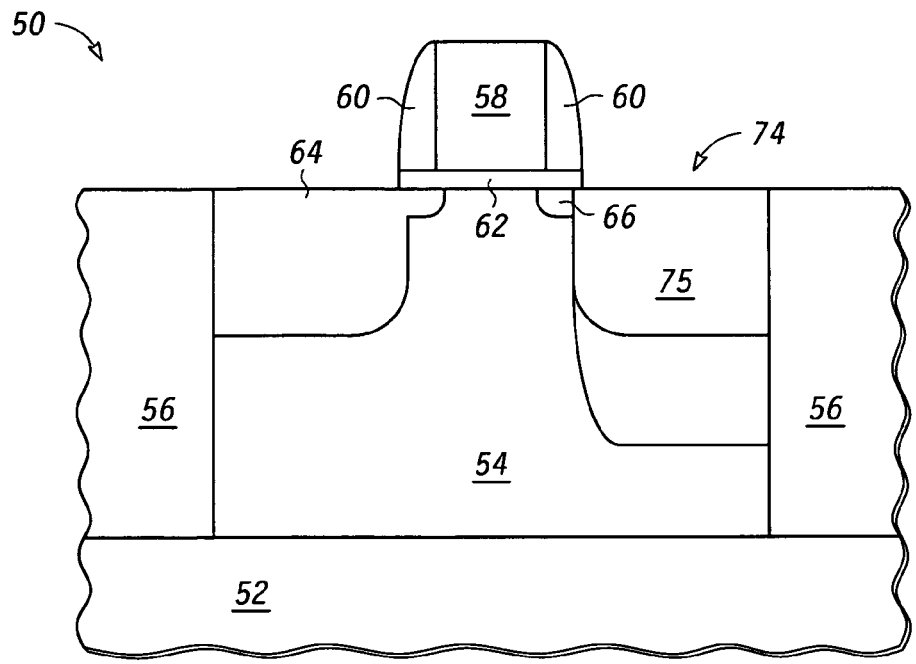
FIG. 3 is a cross section of the semiconductor structure of FIG. 2 at a subsequent stage in processing according to one embodiment of the present invention.

Shown in FIG. 3 is semiconductor structure 50 after filling recess 70 with a semiconductor fill 74. In one embodiment, semiconductor fill 74 is epitaxially grown, thus having a same crystal structure of semiconductor layer 54. In one embodiment, the material for semiconductor fill 74 is an alloy of at least two elements. Note also that the alloy includes at least one element having a lattice constant that is different from the lattice constant of semiconductor layer 54. Also note that in one embodiment, the alloy includes at least one element which is the same as an element within semiconductor layer 54. The alloy, for example, may be silicon carbon, silicon germanium, and silicon germanium carbon. The alloy therefore includes a first element (e.g., silicon), a second element (e.g., carbon or germanium), and may include a third element (e.g., germanium or carbon) or more. Both the first element and the second element include valence numbers. For example, the silicon, carbon and germanium each have a valence number of 4. The sum of the valence numbers of the first element and the second element is eight. In one embodiment, the alloy is silicon germanium carbon. The first element can be either silicon, germanium, or carbon, and the second element can be one of the remaining two elements. In this embodiment, since each of the three elements has a valence number of four, the sum of the valence numbers for the first and second elements will be eight.

For example, in the embodiment in which semiconductor layer 54 is silicon, semiconductor fill 74 may be an alloy of silicon (which is the same as the element in semiconductor layer 54) and germanium (which has a different lattice constant than the element of semiconductor layer 54) if semiconductor structure 50 is a P channel device (i.e. a PMOS device), or an alloy of silicon (which is the same as the element in semiconductor layer 54) and carbon (which has a different lattice constant than the element of semiconductor layer 54) if semiconductor structure 50 is an N channel device (i.e. an NMOS device). However, note that additional elements may be used in each alloy. For example, a silicon germanium carbon alloy, which has a formula of $Si_{1-x-y}Ge_xC_y$, can be used in either the PMOS or NMOS case. In one embodiment, x is equal to 10y. If x is greater than 10y, then the silicon germanium carbon has a lattice that is more like silicon germanium (for, e.g., PMOS devices) and if x is less than 10y, then the silicon germanium carbon has a lattice that is more like silicon carbon (for, e.g., NMOS device). When the germanium content is increased compressive stress is increased and when carbon content is increased tensile stress increases.

In the illustrated embodiment of FIG. 3, the channel region in semiconductor layer 54, below gate dielectric 62, includes one element of the alloy of semiconductor fill 74 (such as, for example, silicon) and is substantially devoid of the other elements of the alloy of semiconductor fill 74. For example, in the above example in which semiconductor layer 54 is silicon, the channel region is substantially devoid of germanium for the P channel case and substantially devoid of carbon for the N channel case. In one embodiment, substantially devoid refers to being less than 0.1% of the lattice density.

Still referring to FIG. 3, semiconductor fill 74 can be in situ doped or doped by implant to become a drain region 75 (having an extension region corresponding to the remaining portion of region 66 and a deep drain region within semiconductor fill 74). Note that each of source region 64 and drain region 75 may be referred to as a current region. The area between source region 64 and drain region 75, below gate dielectric 62, may be referred to as the channel region. Therefore, the channel region is horizontally adjacent at least a portion of source region 64 and drain region 75. Also note that in the illustrated embodiment, the channel region has a first side and a second side, where the second side is laterally opposite the first side. In the illustrated embodiment, at least a portion of source region 64 is within semiconductor layer 54 and laterally adjacent the first side of the channel region, and at least a portion of drain region 75 is within semiconductor layer 54 and laterally adjacent the second side of the channel region. Therefore, note that in one embodiment, semiconductor structure 50 may be referred to as a horizontal device.

Figure 8:
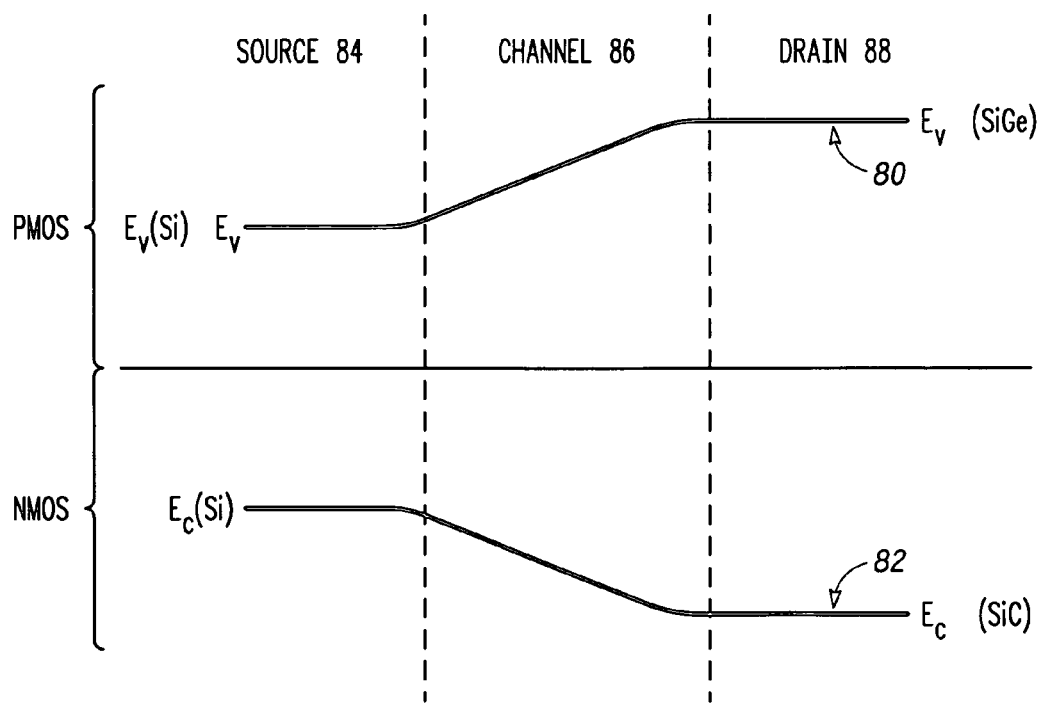
FIG. 8 illustrates energy bands in accordance with one embodiment of the present invention.

The use of an alloy having an element with a different lattice constant than that of semiconductor layer 54 results in a compressive or tensile stressed channel region which helps improve carrier mobility. The resulting energy band due to the stresses introduced by the asymmetrical source and drain regions also result in energy bands which facilitate electronic transport. For example, in the PMOS case, the use of an alloy such as SiGe results in a compressive stressed channel region which helps improve hole mobility. Also, since the source and drain regions of semiconductor structure 50 are asymmetrical (due to semiconductor fill 74), the resulting valence band gradient facilitates hole transport. Referring to FIG. 8, an example valence band gradient $E_v$ 80 is illustrated for a PMOS device which uses SiGe for semiconductor fill 74. Note that $E_v$ 80 begins in a source 84 of a device at a starting level, increases (with respect to vacuum level) throughout a channel region 86 of the device, and ends at a drain 88 of the device at a higher level than the starting level. Therefore, the gradient of the valence band within channel region 86 (due to the change from Si to SiGe from the source to the drain of the device) facilitates hole transport, thus resulting in enhanced device performance. Note that if symmetrical source and drain regions are used (such as symmetrical SiGe source and drain regions) to stress the channel region, hole mobility may be improved; however, the resulting energy band gradient in the source side of the channel region would oppose hole transport, which may adversely affect device performance.

In the NMOS case, the use of an alloy such as SiC results in a tensile stressed channel region which helps improve electron mobility. Also, since the source and drain regions of semiconductor structure 50 are asymmetrical (due to semiconductor fill 74), the resulting conduction band gradient facilitates electron transport. Referring to FIG. 8, an example conduction band gradient $E_c$ 82 is illustrated for an NMOS device which uses SiC for semiconductor fill 74. Note that $E_c$ 82 begins in a source 84 of a device at a starting level, decreases (with respect to vacuum level) throughout a channel region 86 of the device, and ends at a drain 88 of the device at a lower level than the starting level. Therefore, the gradient of the conduction band within channel region 86 (due to the change from Si to SiGe from the source to the drain of the device) facilitates electron transport, thus resulting in enhanced device performance. Note that if symmetrical source and drain regions are used (such as symmetrical SiC source and drain regions) to stress the channel region, electron mobility may be improved; however, the resulting conduction band gradient in the source side of the channel region would oppose electron transport, which may adversely affect device performance.

Figure 4:
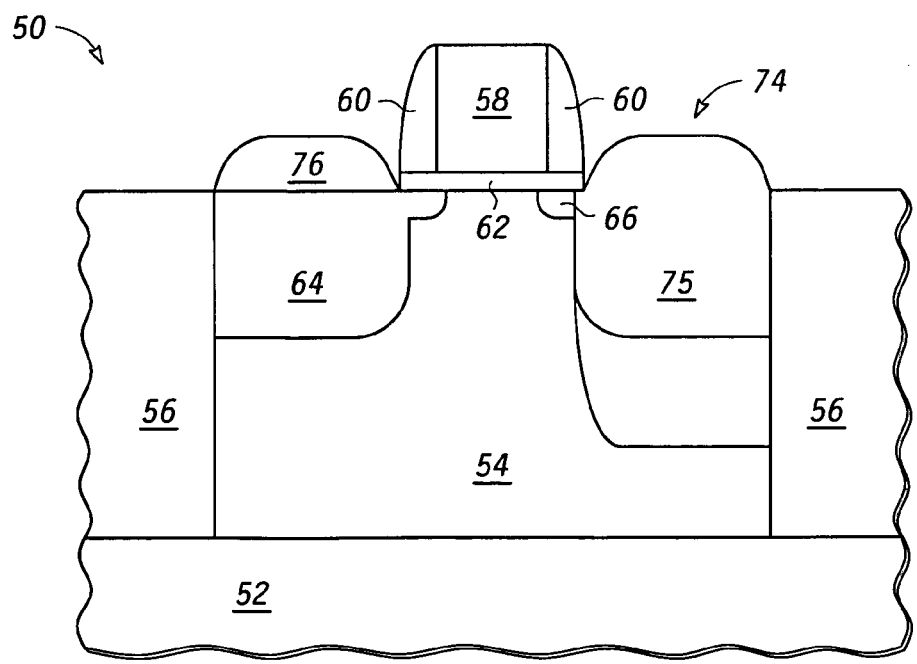
FIG. 4 is a cross section of the semiconductor structure of FIG. 2 at a subsequent stage in processing according to an alternate embodiment of the invention.

Shown in FIG. 4 is an alternate embodiment similar to that of FIG. 3 in which raised source and drains are formed (also referred to as elevated source and drains). Semiconductor fill 74 in FIG. 4 results in a raised drain region 75, and raised portion 76 with source region 64 results in a raised source region. The descriptions provided above for semiconductor fill 74 also apply in this embodiment. In one embodiment, raised portion 76 is of the same material as source region 64. However, in an alternate embodiment, raised portion 76 may be of a same material as semiconductor fill 74. In this case, sheet resistance may also be improved. For example, in the PMOS case, raised portion 76 may also be SiGe. Since raised portion 76 is on semiconductor layer 54 and not recessed into it, it induces minimal stress on the channel region, therefore, still allowing for the valence band gradient as shown in FIG. 8. In this case, the use of SiGe for raised portion 76 may reduce sheet resistance and further enhance performance of semiconductor structure 50. Also, note that source region 64 and raised portion 76, together, may be referred to as a current region, and raised drain region 75 may also be referred to as a current region. The area between source region 64 and drain region 75, below gate dielectric 62 may be referred to as the channel region. Therefore, the channel region is horizontally adjacent at least a portion of source region 64 and drain region 75.

Figure 5:
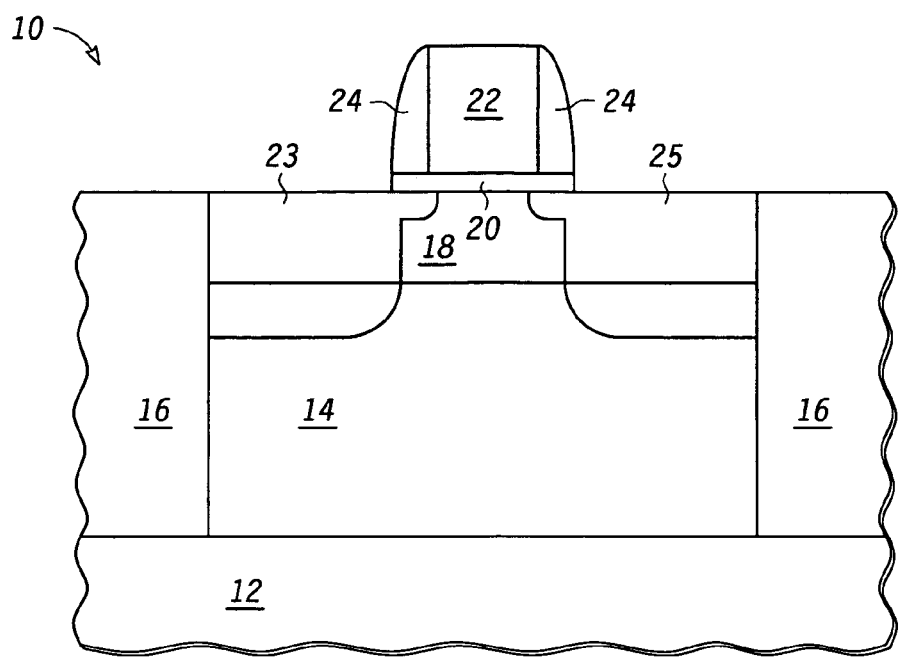
FIG. 5 is a cross section of a semiconductor structure at a first stage in processing according to another alternate embodiment of the present invention.
Figure 6:
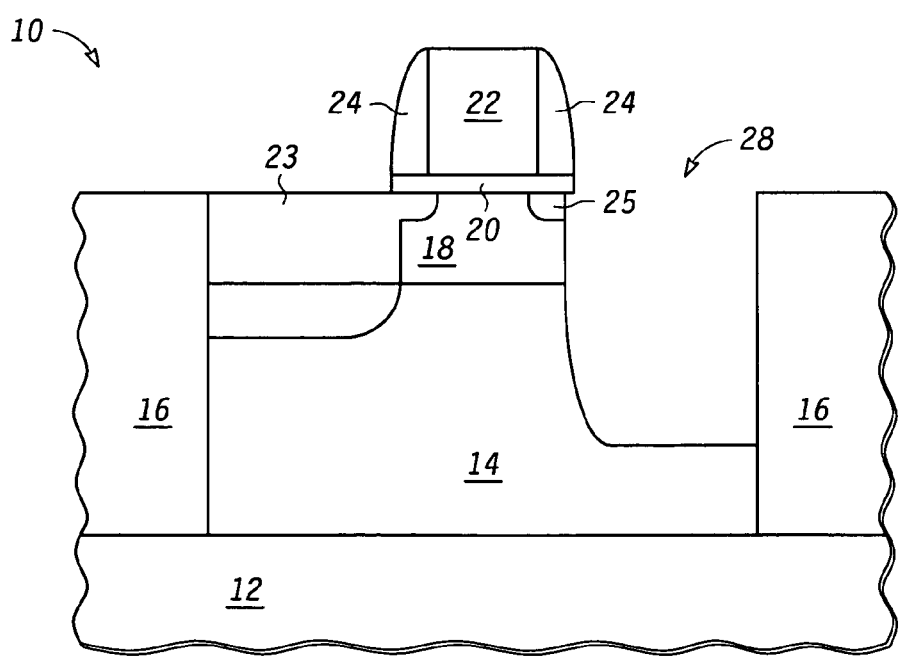
FIG. 6 is a cross section of the semiconductor structure of FIG. 5 at a subsequent stage in processing according to one embodiment of the present invention.
Figure 7:
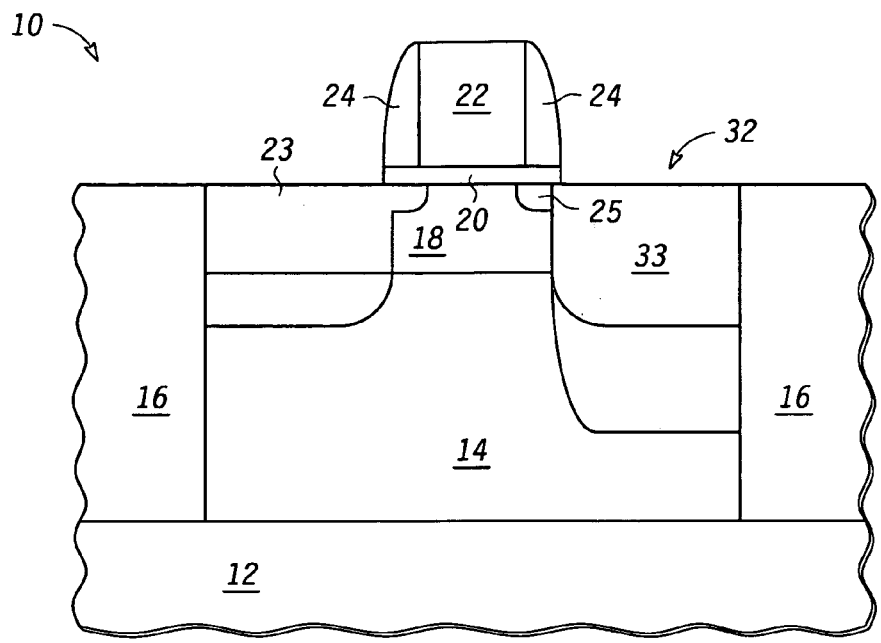
FIG. 7 is a cross section of a semiconductor structure of FIG. 6 at a subsequent stage in processing according to one embodiment of the present invention.

FIGS. 5–7 illustrate a semiconductor structure 10 in accordance with an alternate embodiment of the present invention. Shown in FIG. 5 is a semiconductor structure 10 comprising an insulating layer 12, a semiconductor layer 14 on insulating layer 12, a trench isolation 16 over insulating layer 12 and surrounding semiconductor layer 14, a semiconductor layer 18 on semiconductor layer 14, a gate dielectric 20 (also referred to as a gate insulator 20) on semiconductor layer 18, a gate 22 (also referred to as a control electrode 22) over gate dielectric 20, a sidewall spacer 24 around gate 22, a source region 23 on one side of gate 22 (where source region 23 includes an extension region which extends under sidewall spacer 24 and a deep implant region which extends deeper into semiconductor layer 14 as compared to the extension region), and a drain region 25 on another side of gate 22 (where source region 25 includes an extension region which extends under sidewall spacer 24 and a deep implant region which extends deeper into semiconductor layer 14 as compared to the extension region). Semiconductor layer 18 is epitaxially grown on semiconductor layer 14. Thus semiconductor layer 18 matches the crystalline structure and nearly matches the crystal spacing of semiconductor layer 14. Due to the forced near matching of the crystal spacing due to the epitaxial growth, the change in material between semiconductor layers 14 and 18 creates a stress in semiconductor layer 18 while semiconductor layer 14 is at least partially relaxed. That the crystal spacing is different, albeit by a relatively small amount, between semiconductor layers 14 and 18, meaning that there is a stress difference.

Note that conventional materials and processing techniques may be used to form semiconductor 10 up to the stage of processing illustrated in FIG. 5. Also, note that gate 22 may be any type of transistor gate formed of any material or stack of materials. In the illustrated embodiment, semiconductor layer 14 is a portion of a semiconductor on insulator (SOI) substrate. In an alternate embodiment, semiconductor layer 14 may be a portion of a bulk semiconductor substrate in which insulating layer 12 is not present.

For the NMOS case, semiconductor layer 14 is preferably silicon and semiconductor layer 18 is preferably silicon carbide. The silicon is preferably relaxed with the result that the silicon carbide is under bi-axial tensile stress. In the alternative, semiconductor layer 14 may be at least partially relaxed silicon germanium and semiconductor layer 18 can be either silicon or silicon carbide either which would be under bi-axial tensile stress.

For the PMOS case, semiconductor layer 14 is preferably silicon and semiconductor layer 18 is preferably silicon germanium. The silicon may be relaxed with the result that the silicon germanium is under bi-axial compressive stress. In the alternative, semiconductor layer 14 may be another semiconductor material on which can be grown semiconductor layer 18 to be under bi-axial compressive stress.

Shown in FIG. 6 is semiconductor structure 10 after etching through portions of drain region 25, semiconductor layer 18, and semiconductor layer 14, to leave a recess 28 on one side of gate 22. The etch may also leave a portion of drain region 25 underlying spacer 24 and gate 22.

Shown in FIG. 7 is semiconductor structure 10 after filling recess 28 with a semiconductor fill 32. In one embodiment, semiconductor fill 32 is epitaxially grown, thus having a same crystal structure of semiconductor layer 18. In one embodiment, the material for semiconductor fill 32 is an alloy of at least two elements. Note also that the effective lattice constant of the alloy is different from the effective lattice constant of semiconductor layer 18. For example, in the embodiment in which semiconductor layer 18 is a silicon germanium alloy (such as for PMOS devices), semiconductor fill 32 may also be a silicon germanium alloy; however, semiconductor fill 32 has a greater germanium content as compared to the channel region (underlying gate dielectric 20) and source region 23. In one embodiment, the content of germanium may be 1.5 times greater in semiconductor fill 32, or, alternatively, 2 times greater. Thus, the greater content results in a different effective lattice constant for the SiGe in semiconductor fill 32 than for the SiGe in the channel region and source region 23. Similarly, for NMOS devices, each of semiconductor layer 18 and semiconductor fill 32 may be a silicon carbon alloy where the effective lattice constant of the silicon carbon alloy in semiconductor fill 32 is different from the effective lattice constant of the silicon carbon alloy in semiconductor layer 18.

Note that the descriptions provided above for the possible alloys and valence numbers provided above with respect to semiconductor fill 74 also apply here to semiconductor fill 32.

Still referring to FIG. 7, semiconductor fill 32 can be in situ doped or doped by implant to become a drain region 33 (having an extension region corresponding to the remaining portion of region 25 and a deep drain region within semiconductor fill 32). Note that each of source region 23 and drain region 33 may be referred to as a current region. The area between source region 23 and drain region 33, below gate dielectric 20 may be referred to as the channel region. Therefore, the channel region is horizontally adjacent at least a portion of source region 23 and drain region 33. Also note that in the illustrated embodiment, the channel region has a first side and a second side, where the second side is laterally opposite the first side. In the illustrated embodiment, at least a portion of source region 23 is within semiconductor layer 18 and laterally adjacent the first side of the channel region, and at least a portion of drain region 33 is within semiconductor layer 18 and laterally adjacent the second side of the channel region. Therefore, note that in one embodiment, semiconductor structure 10 may be referred to as a horizontal device.

The use of an alloy having a different effective lattice constant than that of semiconductor layer 18 (in which the content of at least one of the alloy elements in the drain region is higher than the content of that alloy element in the source and channel regions) results in an asymmetrical device having a compressive or tensile stressed channel region which helps improve carrier mobility. The resulting energy band due to the stresses introduced by the asymmetrical source and drain regions also results in energy bands which facilitate electronic transport.

For example, similar to what is illustrated in FIG. 8, the valence band gradient for a PMOS device with an asymmetrical source and drain such as in FIG. 7 will generally increase (with respect to vacuum level) from a starting level at the source, through the channel region, to an ending level at the drain that is higher than the starting level. The gradient of the valence band within the channel region (due to the change in content of an element of the alloy, such as Ge, from the source to the drain of the device) facilitates hole transport, thus resulting in enhanced device performance. Similarly, the conduction band gradient for an NMOS device with an asymmetrical source and drain such as in FIG. 7 will generally decrease from a starting level at the source, through the channel region, to an ending level at the drain that is lower than the starting level. The gradient of the conduction band within the channel region (due to the change in content of an element of the alloy, such as C, from the source to the drain of the device) facilitates electron transport, thus resulting in enhanced device performance.

One embodiment of the present invention relates to a semiconductor device having a semiconductor substrate, a first current region where at least a portion of the first current region is within the semiconductor substrate, a channel region horizontally adjacent at least a portion of the first current region, and a second current region horizontally adjacent the channel region. The second current region has a content of a first element of an alloy greater than a content of the first element in the first current region. The second current region has a content of the first element greater than a content of the first element in the channel region. The alloy further comprises a second element. The first element has a first valence number, the second element has a second valence number, and a sum of the first valence number and the second valence number is eight.

Another embodiment of the present invention relates to a semiconductor device having a semiconductor substrate, a first current region where at least a portion of the first current region is within the semiconductor substrate, and a second current region. At least a portion of the first current region is within the semiconductor substrate. The second current region has a content of a first element of an alloy. The alloy further comprises a second element. The first element has a first valence number, the second element has a second valence number, and a sum of the first valence number and the second valence number is eight. The semiconductor device further includes a channel region between the first current region and the second current region, wherein the channel region is substantially devoid of the first element.

Yet another embodiment relates to a method of forming a semiconductor substrate. The method includes providing a semiconductor substrate, forming a gate insulator over the semiconductor substrate, forming a gate insulator over the semiconductor substrate, forming a control electrode over the gate insulator, providing a channel region under the gate insulator, forming at least a portion of a first current electrode within the semiconductor substrate where the first current electrode is laterally adjacent the first side of the channel region, removing a portion of the semiconductor substrate laterally adjacent the second side of the channel region to form a recess, and forming at least a portion of a second current electrode region within the recess. The channel region has a first side and a second side, and the second side is laterally opposite the first side. The second current electrode region comprises a first element of an alloy. The second current region has a content of a first element of an alloy. The alloy further comprises a second element. The first element has a first valence number, the second element has a second valence number, and a sum of the first valence number and the second valence number is eight. The second current region has a content of a first element of an alloy greater than a content of the first element in the first current region. The second current region has a content of the first element greater than a content of the first element in the channel region.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   a semiconductor substrate;
   a first current region, wherein at least a portion of the first current region is within the semiconductor substrate;
   a channel region horizontally adjacent at least a portion of the first current region; and
   a second current region horizontally adjacent the channel region, wherein:
      the second current region has a content of a first element of an alloy greater than a content of the first element in the first current region;
      the second current region has a content of the first element greater than a content of the first element in the channel region;
      the alloy further comprises a second element;
      the first element has a first valence number;
      the second element has a second valence number, and
      a sum of the first valence number and the second valence number is eight.

2. The semiconductor device of claim 1, wherein the alloy is a semiconductor material.

3. The semiconductor device of claim 1, wherein the first current region is an elevated source region and the second current region is an elevated drain region.

4. The semiconductor device of claim 1, wherein the channel region comprises a third element and the third element is the same as the second element of the alloy.

5. The semiconductor device of claim 4, wherein the channel region and the semiconductor substrate are a same material.

6. The semiconductor device of claim 4, wherein the channel region and the semiconductor substrate are different materials.

7. The semiconductor device of claim 1, wherein the second current region is a drain region.

8. The semiconductor device of claim 7, wherein the first element is germanium and the second element is silicon.

9. The semiconductor device of claim 8, wherein the channel region is P-type.

10. The semiconductor device of claim 7, wherein the first element is carbon and the second element is silicon.

11. The semiconductor device of claim 10, wherein the channel region is N-type.

12. The semiconductor device of claim 11, wherein the first current region comprises a first region within the semiconductor substrate and a second region over the first region, wherein the second region comprises the alloy and the first region comprises the second element.

13. A semiconductor device comprising:
a semiconductor substrate;
a first current region, wherein at least a portion of the first current region is within the semiconductor substrate;
a second current region, wherein:
at least a portion of the second current region is within the semiconductor substrate;
the second current region has a content of a first element of an alloy greater than a content of the first element in the first current region;
the alloy further comprises a second element;
the first element has a first valence number;
the second element has a second valence number; and
a sum of the first valence number and the second valence number is eight; and
a channel region between the first current region and the second current region, wherein the channel region is substantially devoid of the first element.

14. The semiconductor device of claim 13, wherein the alloy is a semiconductor material.

15. The semiconductor device of claim 13, wherein the channel region comprises a third element and the third element is the same as the second element of the alloy.

16. The semiconductor device of claim 15, wherein the channel region and the semiconductor substrate are a same material.

17. The semiconductor device of claim 15, wherein the channel region and the semiconductor substrate are different materials.

18. The semiconductor device of claim 13, wherein the second current region is a drain region.

19. The semiconductor device of claim 18, wherein the first element is germanium and the second element is silicon.

20. The semiconductor device of claim 19, wherein the channel region is P-type.

21. The semiconductor device of claim 18, wherein the first element is carbon and the second element is silicon.

22. The semiconductor device of claim 21, wherein the channel region is N-type.

23. The semiconductor device of claim 13, wherein the first current region is an elevated source region and the second current region is an elevated drain region.

24. The semiconductor device of claim 23, wherein the first current region comprises a first region within the semiconductor substrate and a second region over the first region, wherein the second region comprises the alloy and the first region comprises the second element.

* * * * *